(12) United States Patent
Shimotsusa

(10) Patent No.: US 9,166,090 B2
(45) Date of Patent: Oct. 20, 2015

(54) SOLID-STATE IMAGE PICKUP DEVICE

(75) Inventor: Mineo Shimotsusa, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 132 days.

(21) Appl. No.: 13/808,877

(22) PCT Filed: Jul. 4, 2011

(86) PCT No.: PCT/JP2011/003796
§ 371 (c)(1),
(2), (4) Date: Jan. 7, 2013

(87) PCT Pub. No.: WO2012/004965
PCT Pub. Date: Jan. 12, 2012

(65) Prior Publication Data
US 2013/0112849 A1    May 9, 2013

(30) Foreign Application Priority Data

Jul. 9, 2010    (JP) ................................ 2010-156926

(51) Int. Cl.
*H01L 27/00*    (2006.01)
*H01L 31/09*    (2006.01)
*H01L 27/146*    (2006.01)

(52) U.S. Cl.
CPC ............ *H01L 31/09* (2013.01); *H01L 27/1464* (2013.01); *H01L 27/14601* (2013.01); *H01L 27/14634* (2013.01); *H01L 27/14636* (2013.01); *H01L 27/14687* (2013.01)

(58) Field of Classification Search
CPC ................... H01L 27/14601; H01L 27/14603; H01L 27/14634

USPC ............ 250/208.1, 214.1; 257/292, 741, 750, 257/751, 762, 774, 777
See application file for complete search history.

(56) References Cited

U.S. PATENT DOCUMENTS

| 2006/0146233 | A1 | 7/2006 | Park |
| 2008/0067680 | A1* | 3/2008 | Sakai et al. ................... 257/751 |
| 2008/0251823 | A1 | 10/2008 | Lee |
| 2009/0184349 | A1 | 7/2009 | Dungan |

FOREIGN PATENT DOCUMENTS

| CN | 101150112 A | 3/2008 |
| JP | 2005-209677 A | 8/2005 |

(Continued)

*Primary Examiner* — Kevin Pyo
(74) *Attorney, Agent, or Firm* — Canon USA, Inc. IP Division

(57) ABSTRACT

A solid-state image pickup device capable of suppressing the generation of dark current and/or leakage current is provided. The solid-state image pickup device has a first substrate provided with a photoelectric converter on its primary face, a first wiring structure having a first bonding portion which contains a conductive material, a second substrate provided with a part of a peripheral circuit on its primary face, and a second wiring structure having a second bonding portion which contains a conductive material. In addition, the first bonding portion and the second bonding portion are bonded so that the first substrate, the first wiring structure, the second wiring structure, and the second substrate are disposed in this order.
Furthermore, the conductive material of the first bonding portion and the conductive material of the second bonding portion are surrounded with diffusion preventing films.

3 Claims, 13 Drawing Sheets

(56) References Cited

FOREIGN PATENT DOCUMENTS

| JP | 2006-191081 A | 7/2006 |
| JP | 2010-067844 A | 3/2010 |
| JP | 2011-009489 A | 1/2011 |
| WO | 2006/109937 A1 | 10/2006 |

\* cited by examiner

SOLID-STATE IMAGE PICKUP DEVICE

TECHNICAL FIELD

The present invention relates to a bonding portion of a solid-state image pickup device.

BACKGROUND ART

In CCD type and amplification-type solid-state image pickup devices used for digital still cameras, camcorders, and the like, in order to obtain high definition images, the sizes of pixels are required to be reduced. However, as the sizes of pixels are reduced more and more, a light receiving area of a photoelectric converter, in a pixel, detecting light is decreased, and the sensitivity is decreased.

In PTL 1, a solid-state image pickup device has been disclosed in which in a CMOS type solid-state image pickup device, which is an amplification-type solid-state image pickup device, in order to ensure a light receiving area of a photoelectric converter, a first substrate provided with photoelectric converters and transfer transistors and a second substrate provided with other circuits are bonded to each other. In PTL 1, for this bonding, a copper bonding pad is used for each pixel.

CITATION LIST

Patent Literature

PTL 1: Japanese Patent Laid-Open No. 2006-191081

SUMMARY OF INVENTION

Technical Problem

However, according to the bonding method disclosed in PTL 1, copper may diffuse from the copper bonding pad into the first substrate and/or the second substrate in some cases. When this metal impurity is mixed in a semiconductor region, a dark current and/or a leakage current may be generated thereby, and as a result, a white spot and the like is generated on an image data to be obtained. In addition, when this metal impurity is mixed in a semiconductor region forming a transistor, the generation of leakage current and/or variation of threshold value is liable to occur, and as a result, an operation failure may arise in some cases. In particular, in a solid image pickup device having several tens of thousands or more of pixels, that is, several tens of thousands or more of bonding portions, serious contamination may start from these bonding portions. A phenomenon as described above is liable to occur when a conductive material, such as copper, having a high diffusion coefficient is used for the bonding portion.

Accordingly, the present invention provides a solid-state image pickup device capable of suppressing the generation of dark current and/or leakage current.

Solution to Problem

A solid-state image pickup device of the present invention, comprises a first substrate provided with a photoelectric converter on its primary face; a first wiring structure disposed on the primary face of the first substrate and having a first bonding portion which contains a conductive material; a second substrate provided with, on its primary face, a part of a peripheral circuit including a control circuit and a readout circuit reading out a signal base on a charge of the photoelectric converter; and a second wiring structure disposed on the primary face of the second substrate and having a second bonding portion which contains a conductive material, wherein the first bonding portion and the second bonding portion are bonded to each other so that the first substrate, the first wiring structure, the second wiring structure, and the second substrate are disposed in this order, and the conductive material of the first bonding portion and the conductive material of the second bonding portion are surrounded with diffusion preventing films.

Advantageous Effects of Invention

Accordingly, the present invention can provide a solid-state image pickup device capable of suppressing the generation of dark current and/or leakage current.

DESCRIPTION OF EMBODIMENTS

Figure 1:
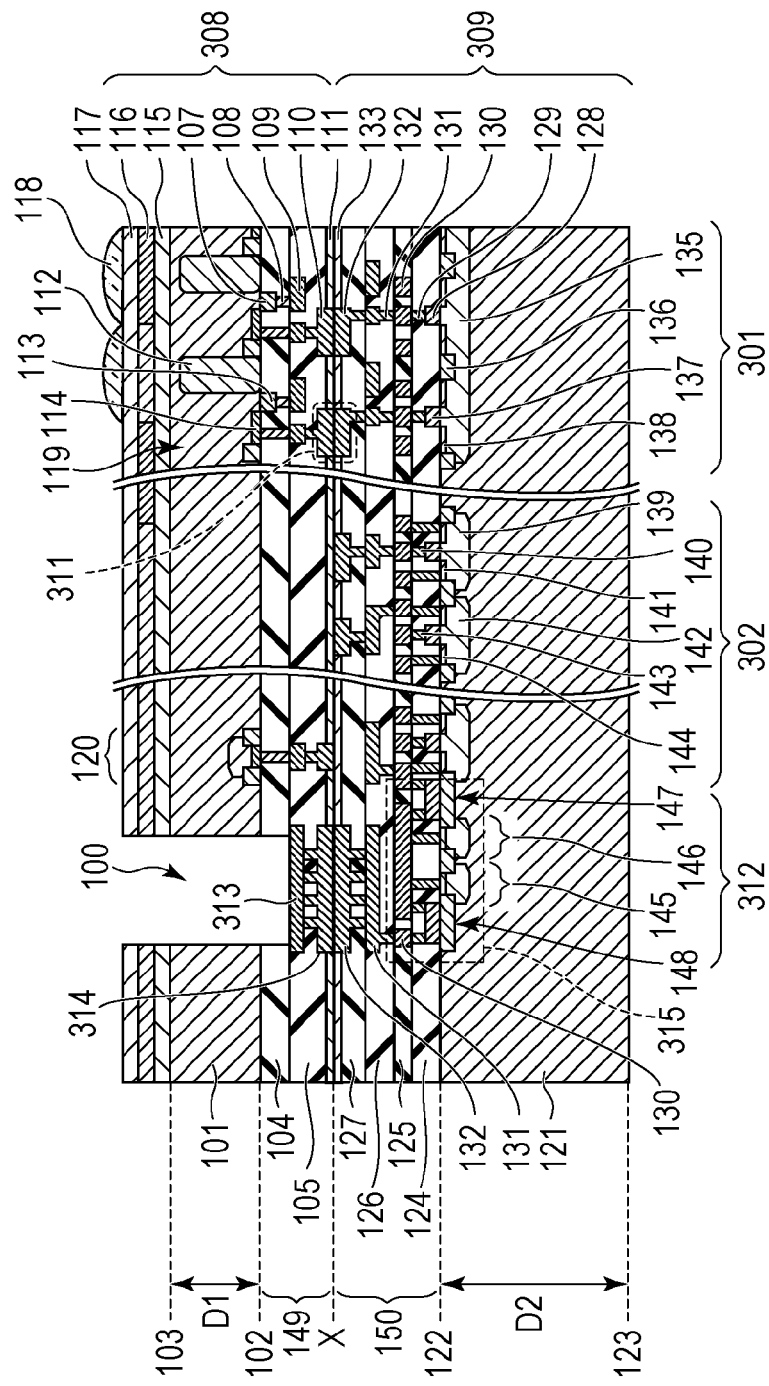
FIG. 1 is a schematic cross-sectional view of a solid-state image pickup device according to Embodiment 1.

A solid-state image pickup device of the present invention has a first substrate provided with photoelectric converters on its primary face, a first wiring structure having first bonding portions, each of which contains a conductive material, a second substrate provided with a part of a peripheral circuit on its primary face, and a second wiring structure having second bonding portions, each of which contains a conductive material. In addition, the first bonding portion and the second bonding portion are bonded to each other so that the first substrate, the first wiring structure, the second wiring structure, and the second substrate are disposed in this order. In this solid-state image pickup device, the conductive material of the first bonding portion and the conductive material of the second bonding portion are surrounded with diffusion preventing films for the respective conductive materials. By the structure as described above, the conductive materials are surrounded with the respective diffusion preventing films even after the bonding, and hence a solid-state image pickup device capable of suppressing the generation of dark current and/or leakage current can be provided.

Hereinafter, the present invention will be described in detail with reference to the drawings. In this embodiment, the primary face of the first substrate and the primary face of the second substrate are substrate surfaces on which transistors are formed. Opposite side faces (opposite side surface) facing the respective primary faces (primary surfaces) are a back face (back surface) of the first substrate and a back face (back surface) of the second substrate. In addition, an upward direction indicates a direction from the back face toward the primary face of the substrate, and a downward direction and a depth direction each indicate a direction from the primary face toward the back face of the substrate. In the following descriptions, when the first and second substrates are bonded with each other, the back face of the second substrate is at the bottom face and the back face of the first substrate is at the top face.

In addition, a wire having a single damascene structure is formed by a single damascene method in which a groove to be used for a wire is formed in an interlayer insulating film, and a conductive material, such as a barrier metal or copper, is filled in the groove, so that a wire buried in the interlayer insulating film is obtained. A wire having a dual damascene structure is formed such that a wire and a via are integrally formed so as to be buried in an interlayer insulating film. That is, the wire having a dual damascene structure is formed by a dual damascene method in which grooves to be used for a wire and a via are formed in an interlayer insulating film, and a conductive material, such as a bather metal or copper, is filled in the grooves.

Embodiment 1 of the present invention will be described with reference to FIGS. 1 to 6B. First, a circuit of a solid-state image pickup device according to Embodiment 1 will be described with reference to FIG. 3. In this embodiment, the case in which a signal electric charge is an electron will be described by way of example. The solid-state image pickup device shown in FIG. 3 has a pixel portion 301 in which a plurality of photoelectric converters is arranged and a peripheral circuit portion 302 having a peripheral circuit which includes a control circuit driving readout of a signal from the pixel portion 301 and a signal processing circuit processing a readout signal.

In the pixel portion 301, photoelectric converters 303, transfer transistors 304, amplification transistors 306, and reset transistors 307 are arranged. A structure including at least one photoelectric converter 303 is defined as a pixel. One pixel of this embodiment includes one photoelectric converter 303, one transfer transistor 304, one amplification transistor 306, and one reset transistor 307. A source of the transfer transistor 304 is connected to the photoelectric converter 303, and a drain region of the transfer transistor 304 is connected to a gate electrode of the amplification transistor 306. A node which is the same as the gate electrode of this amplification transistor 306 is defined as a node 305. The reset transistor 307 is connected to the node 305 and sets the electric potential thereof to an arbitrary electric potential (such as, a reset electric potential). In this structure, the amplification transistor 306 is a part of a source follower circuit and outputs a signal corresponding to the electric potential of the node 305 to a signal line RL. The node 305 may also be called a floating diffusion in some cases.

The peripheral circuit portion 302 indicates a region other than the pixel portion 301. In the peripheral circuit portion 302, a peripheral circuit including a readout circuit and a control circuit is disposed. The peripheral circuit has a vertical scanning circuit VSR which is a control circuit supplying control signals to the gate electrodes of the transistors of the pixel portion 301. In addition, the peripheral circuit has a readout circuit RC which maintains signals outputted from the pixel portion 301 and performs signal processing, such as amplification, addition, and AD conversion. Furthermore, the peripheral circuit has a horizontal scanning circuit HSR which is a control circuit controlling the timing for sequentially outputting signals from the readout circuit RC.

In addition, the solid-state image pickup device according to Embodiment 1 is formed by bonding two members to each other. The two members are a first member 308 having a first substrate 101 and a second member 309 having a second substrate 121. The photoelectric converters 303 and the transfer transistors 304 of the pixel portion 301 are arranged on the first substrate, and the amplification transistors 306 and the reset transistors 307 of the pixel portion 301 and at least a part of the peripheral circuit are arranged on the second substrate. A control signal from the peripheral circuit of the second member 309 to the gate electrode of the transfer transistor 304 of the first member 308 is supplied via a bonding portion 310. The structure of the bonding portion 310 will be described later. A signal generated in the photoelectric converter 303 of the first member 308 is read out at the drain region of the transfer transistor 304, that is, at the node 305. The node 305 includes the structure formed in the first member 308 and the structure formed in the second member 309.

According to the structure as described above, compared to a related case in which all the pixel portion is disposed on one member (that is, on one large substrate), the area of the photoelectric converter 303 can be increased, and hence the sensitivity can be improved. In addition, compared to the related case in which all the pixel portion is disposed on one member (that is, on one large substrate), when the area of the photoelectric converter is not changed, the number of the photoelectric converters 303 can be increased, and hence the number of pixels can be increased. In addition, compared to the related case in which all the pixel portion and all the peripheral circuit portion are disposed on one member (that is, on one large substrate), it becomes easy to separately form the pixel portion and the peripheral circuit portion.

Figure 2A:
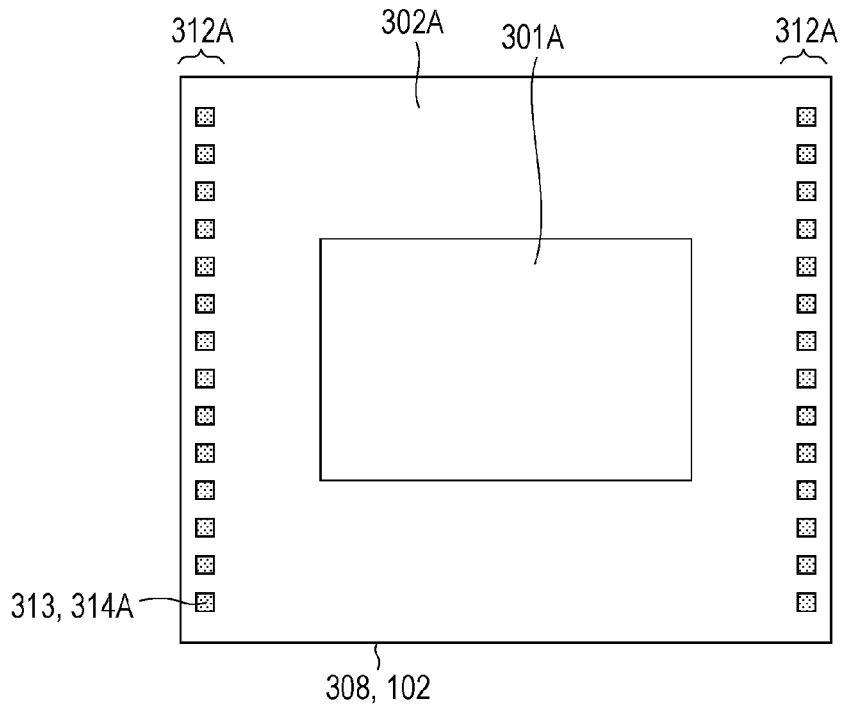
FIG. 2A is a schematic plan view of the solid-state image pickup device according to Embodiment 1.

A specific plan layout of the solid-state image pickup device as described above will be described using schematic plan views of a solid-state image pickup device shown in FIGS. 2A and 2B. FIG. 2A shows a plan layout of the first member 308, that is, the first substrate 101, and FIG. 2B shows a plan layout of the second member 309, that is, the second substrate 121.

Figure 3:
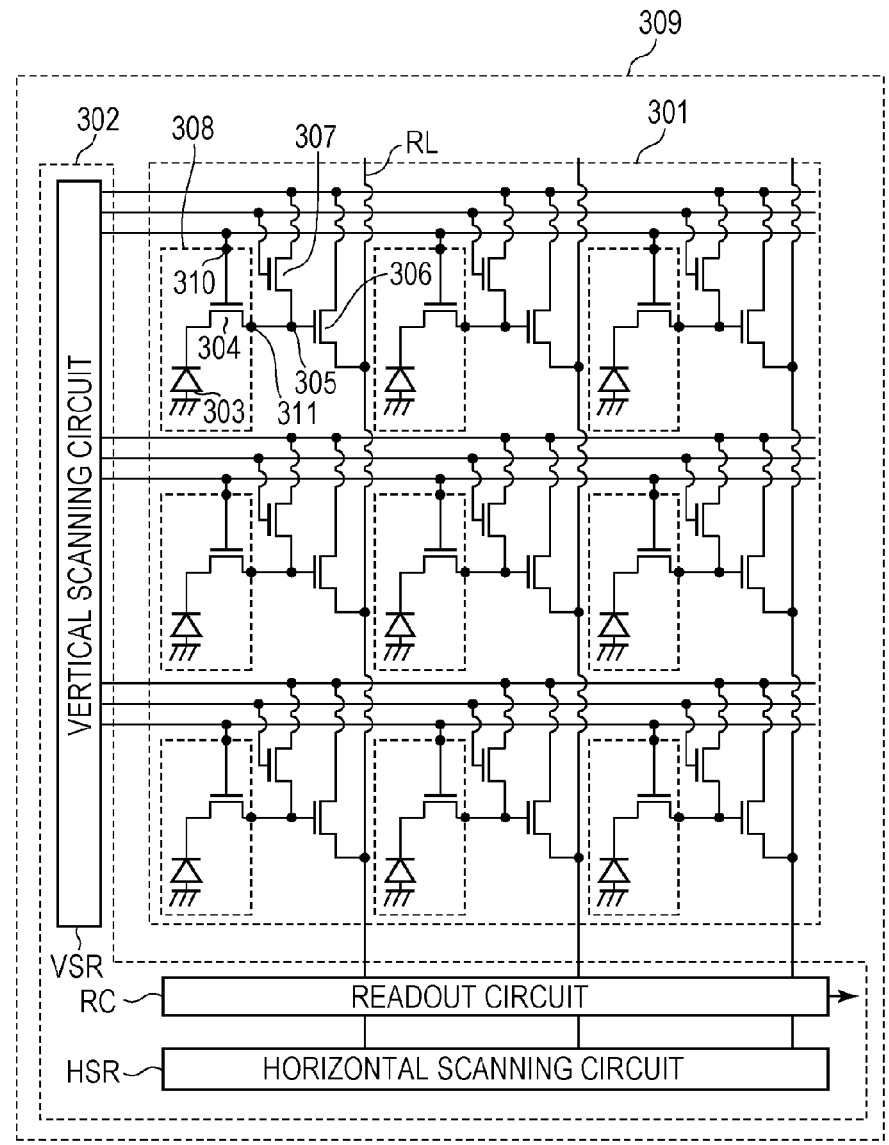
FIG. 3 is a circuit diagram of the solid-state image pickup device according to Embodiment 1.

In FIG. 2A, in the first member 308, there are disposed a pixel portion 301A in which photoelectric converters are arranged and pad portions 312A in each of which pads 313 are arranged. In the pixel portion 301A, the photoelectric converters 303, the transfer transistors 304, the bonding portions 310, and bonding portions 311 shown in FIG. 3 are disposed. In addition, bonding portions 314A for connection to the second member 309 are disposed at the same position as those of the pads 313 when viewed along a direction perpendicular to the primary face of the substrate 101. An external terminal is connected to the pad 313. The pads 313 are disposed in the solid-state image pickup device and include pads, each of which outputs a signal (image signal) based on a charge generated in the photoelectric converter, and pads to each of which a voltage or the like supplied from the outside to drive the peripheral circuit is inputted.

Figure 2B:
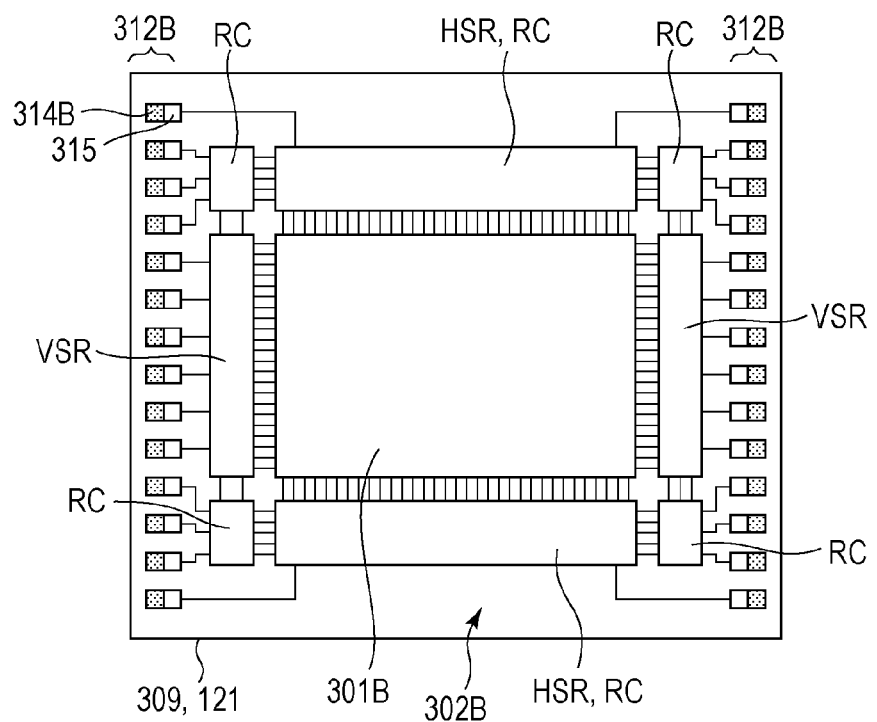
FIG. 2B is a schematic plan view of the solid-state image pickup device according to Embodiment 1.

Next, in FIG. 2B, a pixel portion 301B, the peripheral circuit portion 302, and pad portions 312B are disposed in the second member 309. A part of a pixel circuit is disposed in the pixel portion 301B, and the amplification transistors 306, the reset transistors 307, and the bonding portions 310 and 311 shown in FIG. 3 are disposed therein. A part of the peripheral circuit is disposed in the peripheral circuit portion 302, and the horizontal scanning circuits HSR, the vertical scanning circuits VSR, and the readout circuits RC are disposed therein. Bonding portions 314B for connection to the first member and protective diode circuits 315 are disposed in the pad portions 312B.

In addition, the first member 308 and the second member 309 which have the plan layouts shown in FIG. 2A and FIG. 2B, respectively, are bonded to each other to form the solid-state image pickup device of this embodiment. In particular, the pixel portion 301A and the pixel portion 301B are disposed so as to overlap with each other. In addition, the bonding portions 314A and the bonding portions 314B are bonded to each other, and the bonding portions 310 and the bonding portions 311 of the first member are bonded to the bonding portions 310 and the bonding portions 311 of the second member, respectively. In addition, in FIGS. 2A and 2B, a region of the first member 308 corresponding to a peripheral circuit portion 302B of the second member 309 is indicated by a peripheral circuit portion 302A. A part of the scanning circuit, that is, a part of the peripheral circuit, may be disposed in the peripheral circuit portion 302A. The structure of this bonding portion will be described later in detail.

Next, the solid-state image pickup device shown in FIGS. 2A, 2B, and 3 will be described with reference to a schematic cross-sectional view shown in FIG. 1. In FIG. 1, the same constituent elements as those in FIGS. 2A, 2B, and 3 are designated by the same reference numerals as those described above, and description will be omitted.

The first member 308 has a first wiring structure 149 and the first substrate 101. The first substrate 101 is, for example, a silicon semiconductor substrate and has a primary face 102 and a back face 103. The transistors are arranged on the primary face 102 of the first substrate. The first wiring structure 149 has interlayer insulating films 104 and 105, a gate electrode layer 107 containing gate electrodes and wires, wiring layers 109 and 110 containing wires, and a contact layer 108 containing contacts and/or vias. In addition, the first wiring structure 149 has a first diffusion preventing film 111. In this embodiment, the numbers of the interlayer insulating film, the wiring layer, and the contact layer included in the first wiring structure 149 may be arbitrarily determined. In addition, the wiring layer 110 of the first wiring structure 149 contains the bonding portions 311 and 314A and is integrated with a contact layer. Hereinafter, the bonding portion indicates a portion at which the conductive material of the first member and the conductive material of the second member, which collectively form an electrical connection, are boned to each other and also indicates the conductive material before bonding.

In the pixel portion 301 of the first member 308, an n-type semiconductor region 112 forming the photoelectric converter, an n-type semiconductor region 114 functioning as the drain of the transfer transistor, and an element isolation structure 119 are disposed in the first substrate 101. The transfer transistor is formed of the n-type semiconductor region 112, the n-type semiconductor region 114, and a gate electrode 113 contained in the gate electrode layer 107. A charge stored in the n-type semiconductor region 112 is transferred to the n-type semiconductor region 114 by the gate electrode 113. An electric potential based on the charge transferred to the n-type semiconductor region 114 is transmitted to the second member 309 via the contact of the contact layer 108, the wire of the wiring layer 109, and the wiring layer 110 containing the contact layer. The wire contained in this wiring layer 110 forms the bonding portion 311. In addition, the photoelectric converter may be a buried photodiode further having a p-type semiconductor region or a photogate and may be appropriately changed.

A planarizing layer 115, a color filter layer 116 containing a plurality of color filters, a planarizing layer 117, and a microlens layer 118 containing a plurality of microlenses are disposed in this order in the pixel portion 301 at a back face 103 side of the first substrate 101. In FIG. 1, although each of the color filters and each of the microlenses are provided for one photoelectric converter, that is, are provided in each pixel, one color filter and one microlens may be provided for a plurality of pixels. The solid-state image pickup device of this embodiment is a so-called back-side illumination-type solid-state image pickup device in which light is incident from a microlens layer 118 side and is received by a photoelectric converter.

In the pad portion 312A of the first member 308, the pads 313 and openings 100 which expose the pads 313 for connection to an external terminal are provided. In addition, the bonding portions 314A, each of which transmits a voltage inputted from the pad 313 to the second member 309, are disposed. The bonding portions 314A are contained in the wiring layer 110 as is the bonding portions of the pixel portion. In addition, in the first member 308, as shown in FIG. 1, an optional circuit element 120 is provided in a region corresponding to the peripheral circuit portion 302B of the second member 309.

The second member 309 has a second wiring structure 150 and the second substrate 121. The second substrate 121 is, for example, a silicon semiconductor substrate and has a primary face 122 and a back face 123. The transistors are arranged on the primary face 102 of the second substrate. The second wiring structure 150 has interlayer insulating films 124 to 127, a gate electrode layer 128 containing gate electrodes and wires, wiring layers 130, 131, and 132 containing wires, and a contact layer 129 containing contacts and/or vias. In addition, the second wiring structure 150 has a second diffusion preventing film 133. In this embodiment, the numbers of the interlayer insulating film, the wiring layer, and the contact layer included in the second wiring structure 150 may be arbitrarily determined. In addition, the wiring layers 131 and 132 of the second wiring structure 150 are each integrated with a contact layer. In addition, the wiring layer 132 contains the bonding portions 311 and 314B.

In the pixel portion 301 of the second member 309, a well 135 forming the amplification transistor which forms the pixel circuit, an n-type semiconductor region 138 forming source/drain regions of the amplification transistor, and an element isolation structure 136 are disposed in the second substrate 121. The amplification transistor is disposed in the well 135 and is formed of a gate electrode 137 contained in the gate electrode layer 128 and the n-type semiconductor region 138 forming the source/drain regions. In this embodiment, the first member 308 is connected to the gate electrodes 137 of the amplification transistors through the bonding portions 311. The bonding portion 311 and the gate electrode 137 of the amplification transistor are connected to each other through the wire and the via of the wiring layer 132, the wire and the via of the wiring layer 131, the wire of the wiring layer 130, and the contact of the contact layer 129. In this case, the node 305 shown in FIG. 3 is formed of the n-type semiconductor region 114, the wires and the vias of the wiring layers 109, 110, 132, 131, and 130, the contacts of the contact layers 108 and 129, and the gate electrode 137 shown in FIG. 1. Other circuits (such as the reset transistor) of the pixel portion 301 are not shown in the figure.

Next, at least a part of the peripheral circuit including the control circuits, such as the horizontal scanning circuit and the vertical scanning circuit, and the readout circuits is disposed in the peripheral circuit portion 302B of the second member 309. FIG. 1 shows an n-type transistor and a p-type transistor in an optional circuit included in the peripheral circuit. An n-type transistor formed of a gate electrode 140 contained in the gate electrode layer 128 and n-type source/drain regions 141 is disposed in a p-type well 139. In addition, a p-type transistor having a gate electrode 143 contained in the gate electrode layer 128 and a p-type semiconductor region 144 forming p-type source/drain regions is disposed in an n-type well 142.

In addition, in the pad portion 312B of the second member 309, there are disposed the protective diode circuit 315 inputting a signal from the pad 313 of the first member 308 and the bonding portion 314B for connection to the first member 308. The bonding portion 314B is contained in the wiring layer 132 as is the bonding portion of the pixel portion. Two diodes 145 and 146 each formed from the semiconductor region and two resistors 147 and 148 formed from the gate electrode layer 128 are contained in the protective diode circuit 315 of this embodiment. A commonly-used protective diode circuit can be applied to this protective diode circuit 315.

In addition, in the solid-state image pickup device according to this embodiment, the primary face 102 of the first substrate 101 and the primary face 122 of the second substrate 121 are disposed to face each other with the first and second wiring structures provided therebetween (facing arrangement). That is, the first substrate, the first wiring structure, the second wiring structure, and the second substrate are disposed in this order. In addition, it can also be said that an upper face of the first wiring structure 149 and an upper face of the second wiring structure 150 are bonded to each other at a bonding plane X. That is, the first member 308 and the second member 309 are bonded to each other at the bonding plane X. The bonding plane X is formed from the upper face of the first wiring structure 149 and the upper face of the second wiring structure 150. The bonding portions disposed in the respective members are bonded to each other at the bonding plane X and ensure the conduction between the members. In addition, the pad 313 of the solid-state image pickup device for exchanging a signal with the outside is disposed above the primary face 122 of the second member 309, and the opening 100 is provided at a first member 308 side.

In this embodiment, in the first wiring structure 149, the wiring layer 109 is formed of wires (aluminum wires) primarily composed of aluminum, and the wiring layer 110 is formed of wires (copper wires) primarily composed of copper and has a dual damascene structure. In addition, in the second wiring structure 150, the wiring layer 130 is formed of copper wires and has a single damascene structure. The wiring layers 131 and 132 are formed of copper wires and each have a dual damascene structure. The bonding portion 311 and the bonding portion 314A formed of the wires contained in the wiring layer 110 are bonded to the bonding portion 311 and the bonding portion 314B formed of the wires contained in the wiring layer 132, respectively, at the bonding plane X by metal bonding. In addition, in the pad portion, the pad 313 for connection to an external terminal is disposed in the same layer as that of the wiring layer 109, that is, at the same height as that thereof, and is a conductive material primarily composed of aluminum. The height of this wiring layer 109 and that of the pad 313 are each a height from the primary face 102 of the first substrate 101.

Figure 4A:
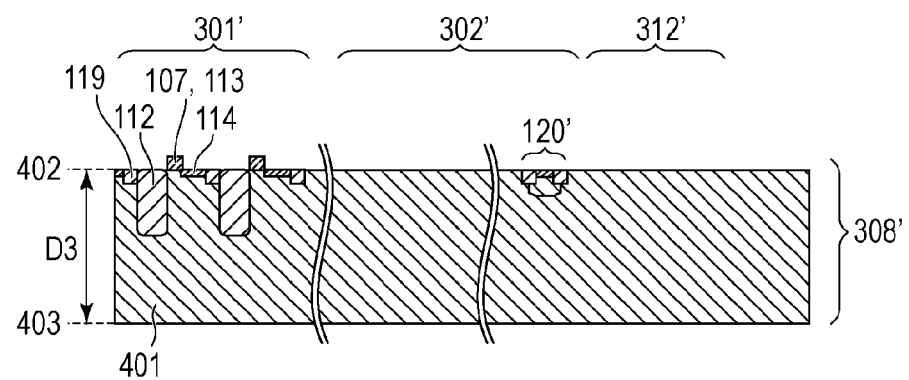
FIG. 4A is a schematic cross-sectional view illustrating a step of a method for manufacturing the solid-state image pickup device according to Embodiment 1.
Figure 4B:
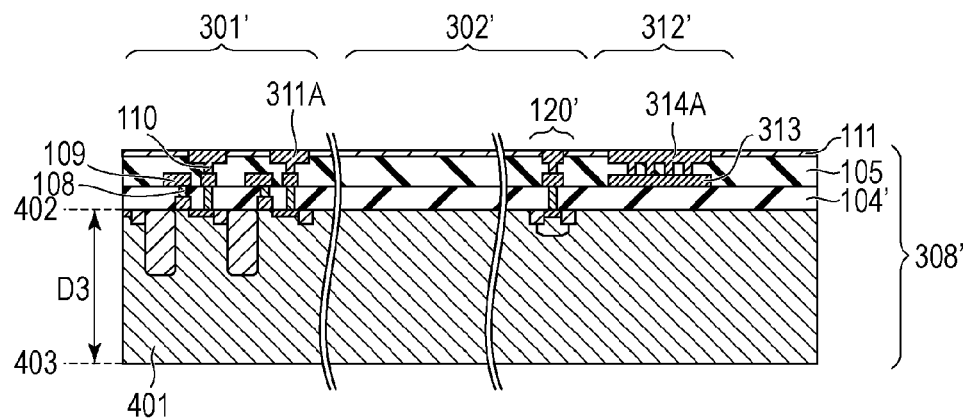
FIG. 4B is a schematic cross-sectional view illustrating a step of the method for manufacturing the solid-state image pickup device according to Embodiment 1.
Figure 5A:
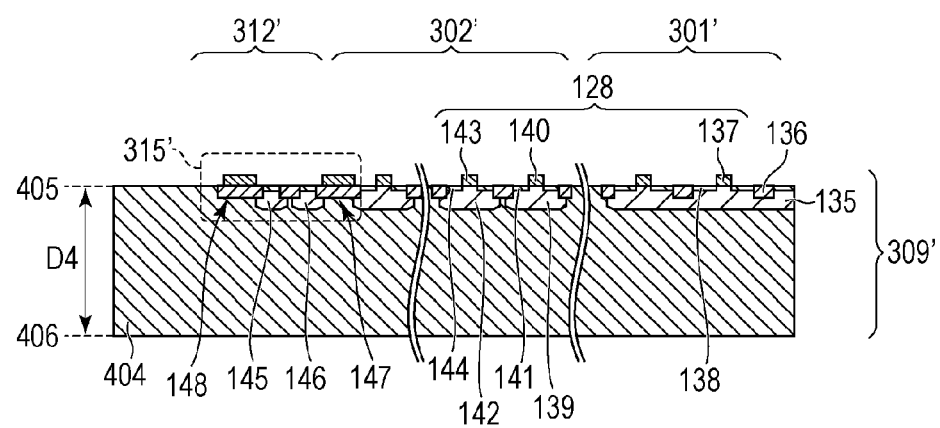
FIG. 5A is a schematic cross-sectional view illustrating a step of the method for manufacturing the solid-state image pickup device according to Embodiment 1.
Figure 5B:
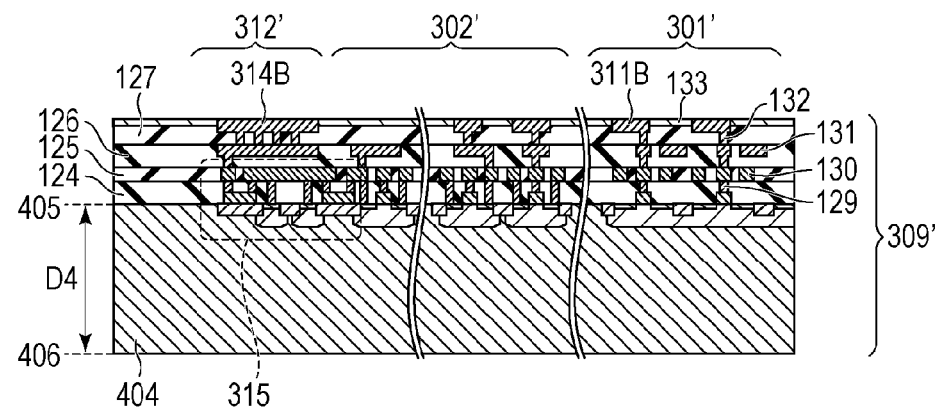
FIG. 5B is a schematic cross-sectional view illustrating a step of the method for manufacturing the solid-state image pickup device according to Embodiment 1.
Figure 6A:
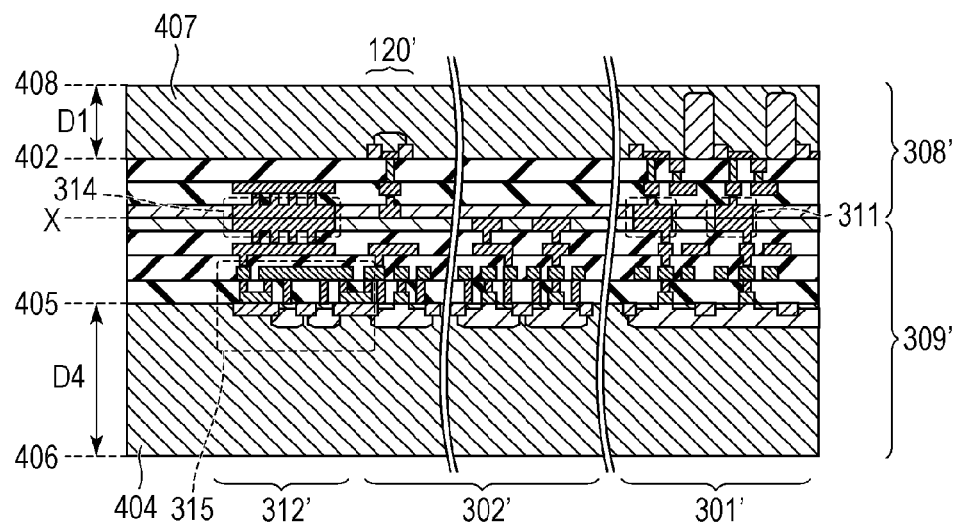
FIG. 6A is a schematic cross-sectional view illustrating a step of the method for manufacturing the solid-state image pickup device according to Embodiment 1.
Figure 6B:
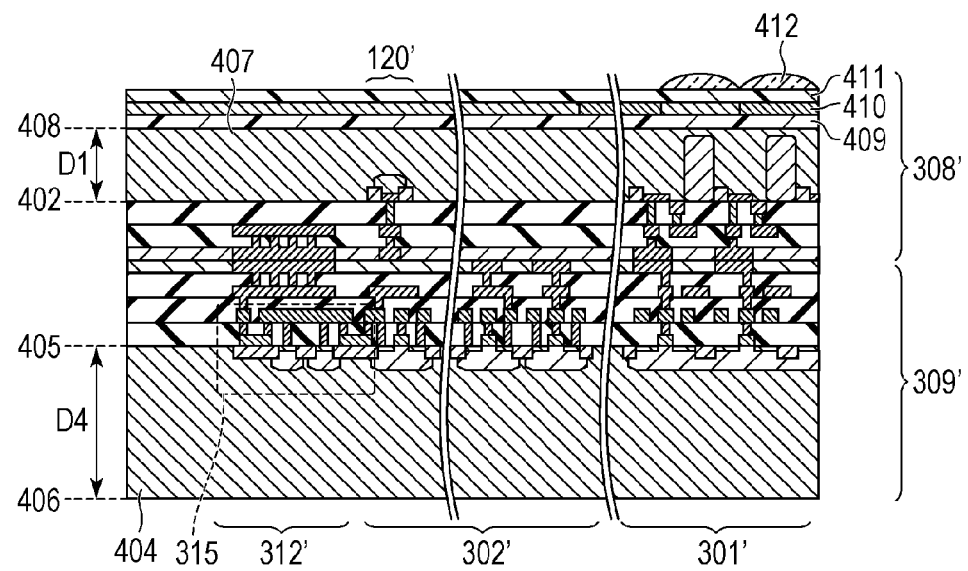
FIG. 6B is a schematic cross-sectional view illustrating a step of the method for manufacturing the solid-state image pickup device according to Embodiment 1.

Next, a method for manufacturing the solid-state image pickup device of this embodiment will be described with reference to FIGS. 4A to 6B. FIGS. 4A and 4B are each a schematic cross-sectional view showing a step of manufacturing the first member 308, FIGS. 5A and 5B are each a schematic cross-sectional view showing a step of manufacturing the second member 309, and FIGS. 6A and 6B are each a schematic cross-sectional view showing a manufacturing step performed after the first member 308 and the second member 309 are bonded to each other.

Steps of manufacturing the first member 308 shown in FIG. 1 will be described with reference to FIGS. 4A and 4B. In FIGS. 4A and 4B, a structure to be later formed into the first member 308 shown in FIG. 1 is represented by 308', and portions to be formed into the pixel portion 301, the peripheral circuit portion 302, the pad portion 312, and the circuit element 120, which is a part of the peripheral circuit, shown in FIG. 1 are represented by 301', 302', 312', and 120', respectively.

First, a semiconductor substrate is provided, and elements are formed in the semiconductor substrate. A semiconductor substrate 401 of a thickness D3 having a primary face 402 and a back face 403 is provided. The semiconductor substrate 401 is, for example, a silicon semiconductor substrate. The element isolation structure 119 is formed in the semiconductor substrate 401. The element isolation structure 119 contains an insulating material, such as a silicon oxide film, and has, for example, a LOCOS or an STI structure. In addition, a well (not shown) having an arbitrary conductivity type is formed in the semiconductor substrate 401. Subsequently, the n-type semiconductor regions 112 and 114 and a p-type semiconductor region (not shown), which form a photoelectric converter and a transistor, are formed. In addition, the gate electrode layer 107 containing the gate electrode 113 of the transfer transistor is formed. The gate electrode layer is formed, for example, by deposition and patterning of a polysilicon layer and may contain a wire as well as the gate electrode. Methods for forming the gate electrode, element isolation, and semiconductor region may be performed in accordance with a general semiconductor process, and detailed description will be omitted. The structure shown in FIG. 4A is obtained by the steps described above.

Next, the wiring structure is formed on the primary face 402 of the semiconductor substrate 401. In particular, first, a film to be formed into an interlayer insulating film 104' is formed so as to cover the gate electrode layer 107. After contact holes are formed in the film to be formed into an interlayer insulating film 104', films of a barrier metal and tungsten are formed, and excessive parts of the films thereof are removed, thereby forming the interlayer insulating film 104' and the contact layer 108. In addition, films of a barrier metal and aluminum are formed on the interlayer insulating film 104', followed by patterning, so that the wiring layer 109 is formed. Next, a film to be formed into the interlayer insulating film 105 is formed so as to cover the wiring layer 109, and a film to be formed into the first diffusion preventing film 111 is formed. Next, the wiring layer 110 is formed by a dual damascene method. Grooves for wires and grooves (holes) for vias are formed in a laminate of the film to be formed into the interlayer insulating film 105 and the film to be formed into the first diffusion preventing film 111. A film of a barrier metal having a diffusion preventing function and a film of copper are formed so as to fill the grooves. The wiring layer 110 is formed by removing excessive bather metal and copper, and the interlayer insulating film 105 and the first diffusion preventing film 111 are formed. In this case, the first diffusion preventing film 111 has openings to expose wires. In addition, the first diffusion preventing film 111 can be simultaneously planarized by etching or chemical mechanical polishing (CMP) performed when a barrier metal and copper are removed. The upper face of the first planarized diffusion preventing film 111 thus planarized has a sufficient flatness for subsequent bonding. The upper face of the wiring structure is formed of the upper face of the first diffusion preventing film 111 and the upper face of wiring layer 110. The interlayer insulating film 104' is later formed into the interlayer insulating film 104 shown in FIG. 1.

In this embodiment, the interlayer insulating films 104' and 105 are each a silicon oxide film. However, the interlayer insulating films 104' and 105 may also be formed, for example, of a silicon nitride film or an organic resin. The contact 108 is formed, for example, from tungsten. The wiring layer 110 contains the bonding portion 314A and a bonding portion 311A, and the wiring layer 109 contains the pad 313. The barrier metal has a function to prevent diffusion of copper which is a conductive material and is formed, for example, of tantalum or tantalum nitride. The first diffusion preventing film 111 is formed of a film which has a diffusion preventing function to the conductive material of the wiring layer 110 containing the bonding portion and is a high-density inorganic insulating film. For example, the diffusion preventing film is a silicon nitride film or a silicon carbide film. Methods for manufacturing these wiring layer, contact layer, and interlayer insulating film can be performed in accordance with a general semiconductor process, and detailed description will be omitted. The structure shown FIG. 4B is obtained by the steps described above. In FIG. 4B, the portions represented by reference numerals 104', 105, 106, 108, 109, and 110 are later used to form the first wiring structure 149 shown in FIG. 1. In addition, the bonding portion 311A later forms the bonding portion 311. In this FIG. 4B, the upper face of the first wiring structure 149 which later forms the bonding plane X shown in FIG. 1 is formed of the upper face of the first diffusion preventing film 111 and the upper face of each wire of the wiring layer 110. The structure of this upper face will be described later in detail.

Next, steps of manufacturing the second member 309 shown in FIG. 1 will be described with reference to FIGS. 5A and 5B. In FIGS. 5A and 5B, a structure to be later formed into the second member 309 shown in FIG. 1 is represented by reference numeral 309', and portions to be formed into the pixel portion 301, the peripheral circuit portion 302, the pad portion 312, and the protective diode circuit 315 shown in FIG. 1 are represented by reference numerals 301', 302', 312', and 315', respectively.

Next, a wiring structure is formed on a primary face 405 of a semiconductor substrate 404. In particular, first, a film to be formed into the interlayer insulating film 124 is formed so as to cover the gate electrode 128. After contact holes are formed in the film to be formed into the interlayer insulating film 124, a film of a barrier metal and a film of tungsten are formed, and the interlayer insulating film 124 and the contact layer 129 are formed by removing excessive parts of the films of a barrier metal and tungsten. In addition, a film to be formed into the interlayer insulating film 125 is formed on the interlayer insulating film 124. Next, the wiring layer 130 is formed by a single damascene method. Grooves for wire are formed in the film to be formed into the interlayer insulating film 125, and a film of a barrier metal having a diffusion preventing function and a film of copper are formed so as to fill the grooves. The wiring layer 130 is formed by removing excessive barrier metal and copper, and the interlayer insulating film 125 is formed. Next, a film to be formed into the interlayer insulating film 126 is formed so as to cover the interlayer insulating film 125 and the wiring layer 130. In addition, the wiring layer 131 is formed by a dual damascene method. In particular, grooves for wires and vias are formed in the film to be formed into the interlayer insulating film 126. A film of a barrier metal having a diffusion preventing function and a film of copper are formed so as to fill the grooves. The wiring layer 131 is formed by removing excessive barrier metal and copper, and the interlayer insulating film 126 is formed. In addition, a film to be formed into the interlayer insulating film 127 and a film to be formed into the second diffusion preventing film 133 are formed so as to cover the interlayer insulating film 126 and the wiring layer 131. Next, the wiring layer 132 is formed by a dual damascene method. That is, grooves for wires and vias are formed in the films to be formed into the interlayer insulating film 127 and the second diffusion preventing film 133, and a film of a barrier metal having a diffusion preventing function and a film of copper are formed so as to fill the grooves. The wiring layer 132 is formed by removing excessive parts of the film of copper and the film of a barrier metal having a diffusion preventing function. In this case, the barrier metal has a diffusion preventing function to copper which is a conductive material and is formed, for example, of tantalum or tantalum nitride. In addition, the interlayer insulating film 127 and the second diffusion preventing film 133 are formed. In this embodiment, the second diffusion preventing film 133 has openings so as to expose wires. In addition, the second diffusion preventing film 133 can be simultaneously planarized by etching or CMP performed when a barrier metal and copper are removed. The upper face of the wiring structure is formed of the upper face of the second diffusion preventing film 133 and the upper face of the wiring layer 132.

In this case, although being formed of silicon oxide, the interlayer insulating films 124 to 127 each may also be formed, for example, of a silicon nitride film or an organic resin. The contact 129 is formed, for example, of tungsten. The wiring layer 130 is formed of wires primarily composed of copper and has a single damascene structure. The wiring layers 131 and 132 are each formed of wires primarily composed of copper and each have a dual damascene structure. The wiring layer 132 contains the bonding portion 314B and a bonding portion 311B. Methods for manufacturing these wiring layer, contact layer, and interlayer insulating film can be performed in accordance with a general semiconductor process, and more detailed description will be omitted. The structure shown in FIG. 5B is obtained by the steps described above. In FIG. 5B, the portions represented, for example, by reference numerals 124 to 127 and 129 to 133 are later used to form the second wiring structure 150 shown in FIG. 1. In addition, the bonding portion 311B later forms the bonding portion 311.

In this FIG. 5B, the upper face of the second wiring structure 150 which later forms the bonding plane X shown in FIG. 1 is formed of the upper face of the interlayer insulating film 127 and the upper face of each wire of the wiring layer 132. The wiring layer 132 is also a conductive material used as the bonding portion. That is, the upper face of the second wiring structure 150 contains the upper face of the conductive material. The structure of this upper face will be described later in detail.

The first member 308' and the second member 309' as shown in FIGS. 4B and 5B, respectively, are bonded together so that the primary face 402 and the primary face 405 of the respective semiconductor substrates face each other. That is, the uppermost face of the wiring structure of the first member 308' and the uppermost face of the wiring structure of the second member 309' are boned to each other. In this embodiment, since the bonding portions 311A and 311B and the bonding portions 314A and 314B are formed of wires primarily composed of copper, when bonding is performed therebetween, metal bonding of copper may be performed. In addition, bonding is preferably performed in a vacuum or an inert gas atmosphere. Furthermore, before bonding is performed, plasma irradiation is preferably performed on the upper face of each wiring structure. By performing this plasma irradiation, compared to the case in which plasma irradiation is not performed, bonding between the interlayer insulating films, such as a silicon oxide film and/or a silicon nitride film, can be more strengthened. In addition, instead of using plasma irradiation, an activation method by a chemical treatment may also be used. By this bonding, the two wiring structures are united into one wiring structure which includes the copper bonding portions surrounded with the diffusion preventing films.

In addition, after the first member 308' and the second member 309' are bonded together, the thickness of the semiconductor substrate 401 of the first member 308' is reduced at a back face 403 side. The reduction of the thickness may be performed by CMP or etching. Accordingly, the semiconductor substrate 401 is formed into a semiconductor substrate 407, and the thickness is changed from D3 to D1 (D1<D3) (FIG. 6A). As described above, since the thickness of the semiconductor substrate 401 is reduced to form the semiconductor substrate 407, subsequently, incident light is able to efficiently enter the photoelectric converter. In addition, at this stage, the thickness D1 of the semiconductor substrate 407 is smaller than a thickness D4 of the semiconductor substrate 404.

Next, a planarizing layer 409 formed of a resin, a color filter layer 410, a planarizing layer 411 formed of a resin, and a microlens layer 412 are formed in this order on a back face 408 of the semiconductor substrate 407. Methods for manufacturing these planarizing layer, color filter layer, and microlens layer can be performed in accordance with a general semiconductor process, and detailed description will be omitted. In this case, the microlens layer may be formed to the region 312' which is to be formed into the pad portion. The structure shown in FIG. 6B is obtained by the steps described above.

In addition, the opening 100 is formed to expose the pad 313. In this step, a photoresist mask having an arbitrary opening is formed on the microlens layer 412 using a photolithographic technique. In addition, using a dry etching technique, the microlens layer 412, the planarizing layer 411, the color filter layer 410, the planarizing layer 409, the semiconductor substrate 407, and the interlayer insulating film 104' are partially removed, thereby forming the opening 100 to expose the pad 313.

Accordingly, the microlens layer 118, the planarizing layers 117 and 115, the color filter layer 116, the first substrate 101, and the interlayer insulating film 104 are formed. As a result, the structure shown in FIG. 1 is obtained. The semiconductor substrate 404, the primary face 405, a back face 406, and the thickness D4 shown in FIG. 6B correspond to the second substrate 121, the primary face 122, the back face 123, and the thickness D2 shown in FIG. 1, respectively. Although the thickness D4 is not changed from the thickness D2 in this case, the thickness of the semiconductor substrate 404 may be reduced so that the thickness D2 is smaller than the thickness D4. Although the number of steps is increased by the reduction in thickness, the solid-state image pickup device can be miniaturized.

Hereinafter, the details of the bonding portion will be described with reference to FIGS. 7A to 7D. FIGS. 7A to 7D are each an enlarged schematic cross-sectional view of the bonding portion 311 shown in FIG. 1. In FIGS. 7A to 7D, the same constituent elements as those shown in FIGS. 1 to 6B are designated by the same reference numerals as those described above, and description will be omitted.

Figure 7A:
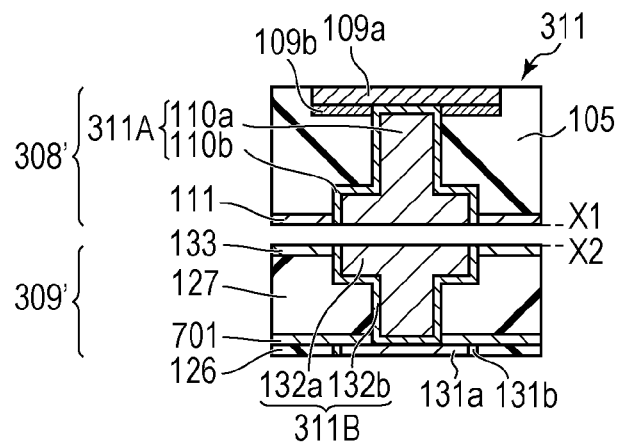
FIG. 7A is a schematic cross-sectional view of a bonding portion of the solid-state image pickup device according to Embodiment 1.
Figure 7B:
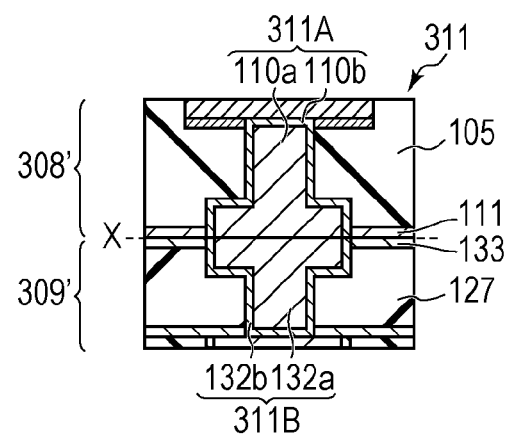
FIG. 7B is a schematic cross-sectional view of the bonding portion of the solid-state image pickup device according to Embodiment 1.

First, FIG. 7A shows the state before the first member and the second member are bonded to each other, and FIG. 7B shows the state in which the two members are bonded to each other (FIG. 6A). The first member 308' has the wiring layer 109, the wiring layer 110, and the first diffusion preventing film 111. The wring layer 109 contains aluminum 109a and a bather metal 109b, and the wiring layer 110 contains copper 110a and a barrier metal 110b. In addition, the second member 309' has the wiring layer 131, the wiring layer 132, and the second diffusion preventing film 133. The wiring layer 131 contains copper 131a and a barrier metal 131b, and the wiring layer 132 contains copper 132a and a barrier metal 132b. That is, the bonding portion contains copper having a higher diffusion coefficient than that of aluminum as a conductive material. In this case, the conductive material is not limited to copper and may be selected from alloys primarily composed of copper, other metals, such as Au, and alloys thereof. In addition, a barrier metal for copper functions as a diffusion preventing film having a capability of preventing diffusion of copper. As this barrier metal, for example, metals, such as a tantalum, manganese, niobium, and chromium, and alloys thereof may be mentioned, and a tantalum nitride film also has a barrier function. In addition, as the first diffusion preventing film and the second diffusion preventing film, for example, a silicon nitride film, a silicon carbide film, silicon carbonitride film, or a silicon oxynitride film may be mentioned. In addition, the copper 110a is surrounded with the barrier metal 110b except for the portion exposed to a plane X1. Furthermore, the copper 132a is surrounded with the barrier metal 132b except for the portion exposed to a plane X2. In this embodiment, the plane X1 is the upper face of the first wiring structure 149, and the plane X2 is the upper face of the second wiring structure 150.

As shown in FIG. 7B, the plane X1 and the plane X2 form the bonding plane X, and the first member 308' and the second member 309' are bonded to each other. The copper 110a and the copper 132a are metal-bonded together. In this case, the copper 110a and the copper 132a are surrounded with the barrier metal 110b and the barrier metal 132b, respectively, each of which is the diffusion preventing film having a diffusion preventing function to copper. According to the structure as described above, since the conductive material is surrounded with the diffusion preventing film at the bonding portion, a solid-state image pickup device capable of suppressing the generation of dark current and/or leakage current can be provided.

Figure 7C:
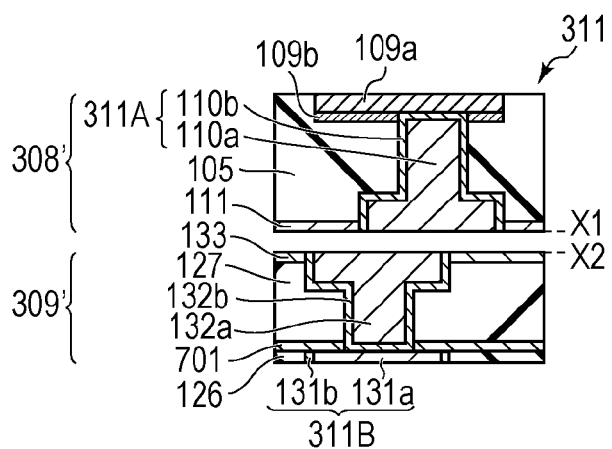
FIG. 7C is a schematic cross-sectional view of a bonding portion of the solid-state image pickup device according to Embodiment 1.
Figure 7D:
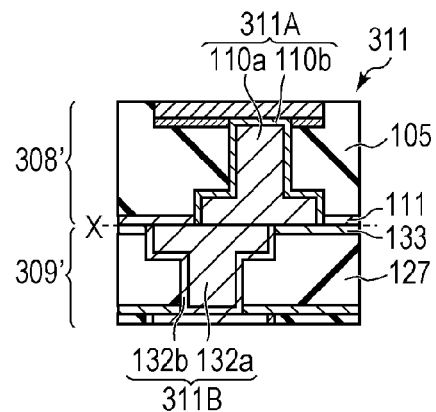
FIG. 7D is a schematic cross-sectional view of the bonding portion of the solid-state image pickup device according to Embodiment 1.

FIG. 7C is a schematic cross-sectional view showing the case in which in the structure shown in FIG. 7A, the positions of the wiring layer 110 and the wiring layer 132, which form the bonding portion, are shifted. In the case as shown in FIG. 7C, since the first diffusion preventing film 111 and the second diffusion preventing film 133 are provided, the conductive material can also be surrounded with the diffusion preventing films at the bonding portion. In particular, as shown in FIG. 7D, the copper 110a and the copper 132a are collectively surrounded with the barrier metal 110b and the barrier metal 132b, each of which is the diffusion preventing film, and the first diffusion preventing film 111 and the second diffusion preventing film 133. By the structure as described above, even if the position is shifted, for example, by variation in process condition, the conductive materials are surrounded with the diffusion preventing films at the bonding portion; hence, a solid-state image pickup device capable of suppressing the generation of dark current and/or leakage current can be provided.

The present invention is not limited to the steps described in the manufacturing method according to this embodiment, and the order of the steps may also be changed. In addition, the order of manufacturing the first member 308 and the second member 309 may be appropriately determined. An SOI substrate may also be applied to each of the semiconductor substrates 401 and 404. In addition, it is also possible that the first member 308 and the second member 309 are separately purchased as the substrates for the solid-state image pickup device and are then bonded together.

Next, Embodiment 2 of the present invention will be described with reference to FIGS. 8A to 9C. In this embodiment, several modifications of the structure of the bonding portion will be described. FIGS. 8A to 8H are each a schematic cross-sectional view focusing on a bonding portion corresponding to that shown in FIGS. 7A to 7D. In FIGS. 8A to 8H, constituent elements similar to those shown in FIGS. 1 to 7D are designated by the same reference numerals as those described above, and description will be omitted.

Figure 8A:
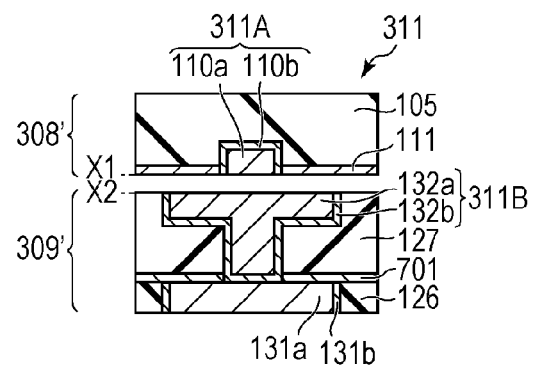
FIG. 8A is a schematic cross-sectional view of a bonding portion of a solid-state image pickup device according to Embodiment 2.
Figure 8B:
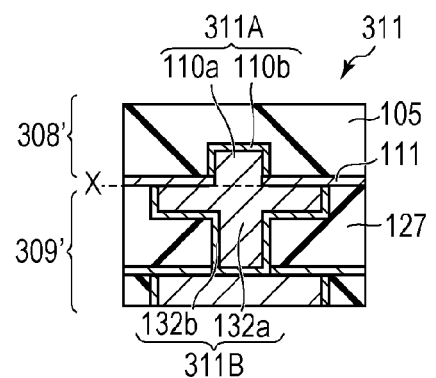
FIG. 8B is a schematic cross-sectional view of the bonding portion of the solid-state image pickup device according to Embodiment 2.

First, the modification of the bonding portion shown in FIGS. 8A and 8B will be described. FIG. 8A is a schematic cross-sectional view corresponding to that shown in FIG. 7A, and FIG. 8B is a schematic cross-sectional view corresponding to that shown in FIG. 7B. In FIG. 8A, the differences from FIG. 7A are that the wiring layer 110 has a smaller exposed area than that of the wiring layer 132 and that the second member 309' has no second diffusion preventing film 133. Although the structure shown in FIG. 8A is only a partial cross-section thereof, the area of the wiring layer 110 at the plane X1 is smaller than the area of the wiring layer 132 at the plane X2. In the structure as described above, as shown in FIG. 8B illustrating the state after bonding, the copper 110a and the copper 132a are also surrounded with the barrier metals 110b and 132b, each of which is the diffusion preventing film, and the first diffusion preventing film 111.

Figure 8C:
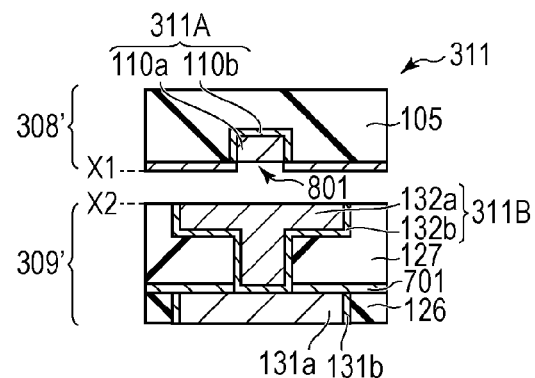
FIG. 8C is a schematic cross-sectional view of a bonding portion of the solid-state image pickup device according to Embodiment 2.
Figure 8D:
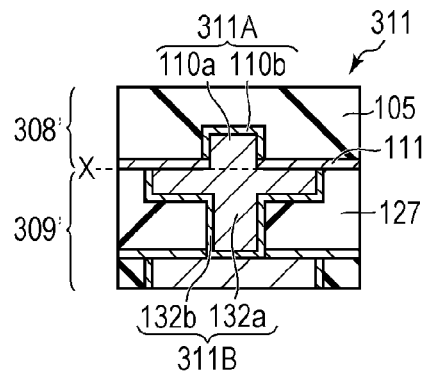
FIG. 8D is a schematic cross-sectional view of the bonding portion of the solid-state image pickup device according to Embodiment 2.

Next, the modification of the bonding portion shown in FIGS. 8C and 8D will be described. FIG. 8C is a schematic cross-sectional view corresponding to that shown in FIG. 8A, and FIG. 8D is a schematic cross-sectional view corresponding to that shown in FIG. 8B. In FIG. 8C, the difference from FIG. 8A is that the wiring layer 110 has a concave portion 801 at the plane X1. In particular, the first diffusion preventing film 111 is disposed on the interlayer insulating film 105 and the wiring layer 110 and has an opening corresponding to the wiring layer 110. In the structure as described above, as shown in FIG. 8D illustrating the state after bonding, the copper 110a and the copper 132a are also surrounded with the barrier metals 110b and 132b, each of which is the diffusion preventing film, and the first diffusion preventing film 111. In this modification, although the concave portion 801 has a step corresponding to the thickness of the first diffusion preventing film 111, the step may be increased, for example, by partially removing the copper 110a. In addition, even if the wiring layer 110 has the concave portion 801, since the coefficient of thermal expansion of a conductive material, such as copper, is larger than that of a dielectric material forming a diffusion preventing film and an interlayer insulating film, the bonding plane X of the bonding may have a flat face as shown in FIG. 8D.

Figure 8E:
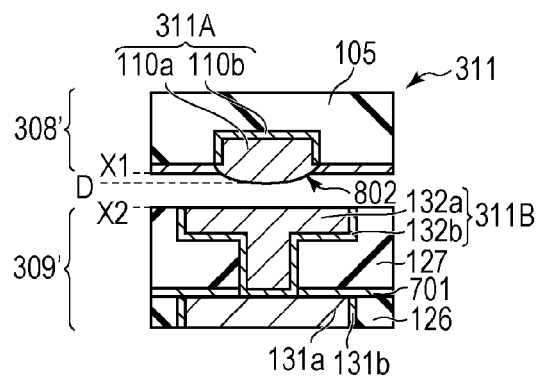
FIG. 8E is a schematic cross-sectional view of a bonding portion of the solid-state image pickup device according to Embodiment 2.
Figure 8F:
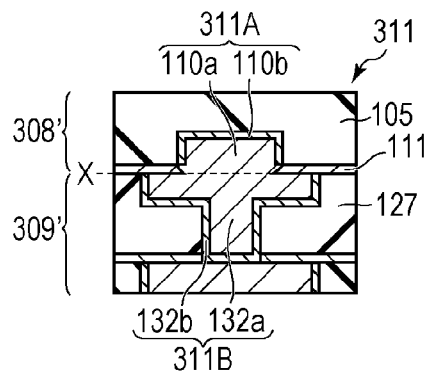
FIG. 8F is a schematic cross-sectional view of the bonding portion of the solid-state image pickup device according to Embodiment 2.

Next, the modification of the bonding portion shown in FIGS. 8E and 8F will be described. FIG. 8E is a schematic cross-sectional view corresponding to that shown in FIG. 8C, and FIG. 8F is a schematic cross-sectional view corresponding to that shown in FIG. 8D. In FIG. 8E, the difference from FIG. 8C is that the wiring layer 110 has a convex portion 802 at the plane X1. In particular, the copper 110a has a convex portion protruding by a thickness D from the plane X1 formed of the first diffusion preventing film 111 and the like. In the structure as described above, as shown in FIG. 8F illustrating the state after bonding, the copper 110*a* and the copper 132*a* are also surrounded with the barrier metals 110*b* and 132*b*, each of which is the diffusion preventing film, and the first diffusion preventing film 111. In the case described above, although having a smooth shape, the convex portion 802 may have a rectangular shape. In addition, since the pressure is applied for bonding, even if the wiring layer 110 has the convex portion 802, the bonding plane X after the bonding may have a flat face as shown in FIG. 8F.

Figure 8G:
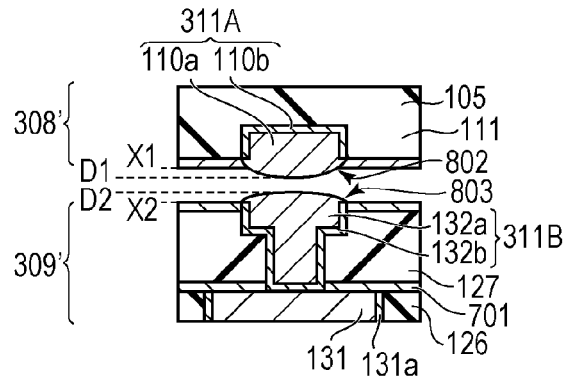
FIG. 8G is a schematic cross-sectional view of a bonding portion of the solid-state image pickup device according to Embodiment 2.
Figure 8H:
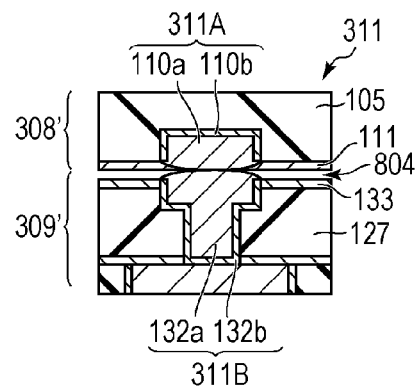
FIG. 8H is a schematic cross-sectional view of the bonding portion of the solid-state image pickup device according to Embodiment 2.

Next, the modification of the bonding portion shown in FIGS. 8G and 8H will be described. FIG. 8G is a schematic cross-sectional view corresponding to that shown in FIG. 8E, and FIG. 8H is a schematic cross-sectional view corresponding to that shown in FIG. 8F. In FIG. 8G, the differences from FIG. 8E is the following three points. That is, the three points are that the wiring layer 132 also has a convex portion 803 at the plane X2, the area of the wiring layer 110 at the plane X1 and the area of the wiring layer 132 at the plane X2 are equal to each other, and the second member 309' has the second diffusion preventing film 133. The copper 110*a* has a convex portion protruding from the plane X1 by a thickness D1, and the copper 132*a* has a convex portion protruding from the plane X2 by a thickness D2. In the structure as described above, as shown in FIG. 8H illustrating the state after bonding, the copper 110*a* and the copper 132*a* are also surrounded with the barrier metals 110*b* and 132*b*, each of which is the diffusion preventing film, the first diffusion preventing film 111, and the second diffusion preventing film 133. In this case, a gap 804 is formed between the first member 308' and the second member 309'. Since the copper 110*a* and the copper 132*a* are in contact with the gap 804, copper may diffuse at the interface with this gap 804 in some cases. However, since the first diffusion preventing film 111 and the second diffusion preventing film 133 are provided, diffusion of copper to the substrate sides of the first member 308' and the second member 309' can be suppressed. Of course, the gap 804 may not be formed in some cases after the first member 308' and the second member 309' shown in FIG. 8G are bonded together.

As described above, also in the structures as shown in FIGS. 8A to 8H, copper can be surrounded with the diffusion preventing film at the bonding portion. Hence, a solid-state image pickup device capable of suppressing the generation of dark current and/or leakage current can be provided.

Figure 9A:
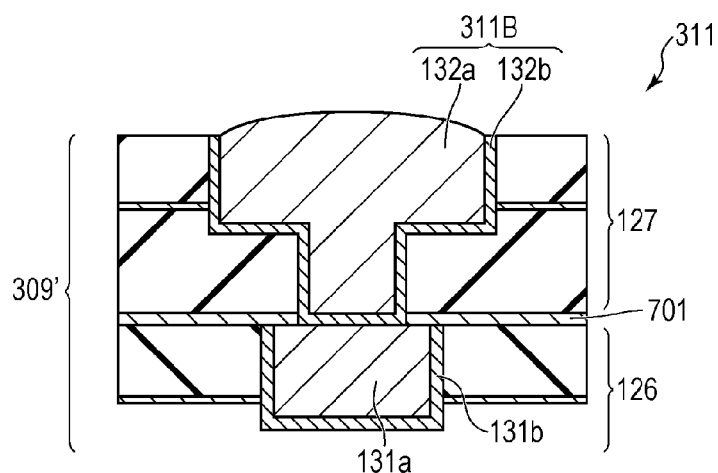
FIG. 9A is a schematic cross-sectional view illustrating a step of a method for manufacturing the bonding portion according to Embodiment 2.

Hereinafter, a formation method of a bonding portion having the convex portion shown in each of FIGS. 8E and 8G will be described focusing on the bonding portion 311B shown in FIG. 8G. First, the interlayer insulating film 126, the wiring layer 131, and the interlayer insulating film 127 are formed. Subsequently, the wiring layer 132 is formed in the interlayer insulating film 127 by a dual damascene method. In this case, when excessive films of copper and barrier metal are removed, the copper 132*a* having a convex portion (a protrusion portion) can be formed by adjusting a polishing speed and a slurry in the case of using a CMP method or by adjusting an etching gas and the like in the case of using etching (FIG. 9A). Next, a film 133' which covers the convex portion and which is to be formed into the second diffusion preventing film is formed (FIG. 9B) and is then partially removed by etching method or CMP method, so that the second diffusion preventing film 133 and the convex portion 803 can be formed (FIG. 9C).

Figure 9B:
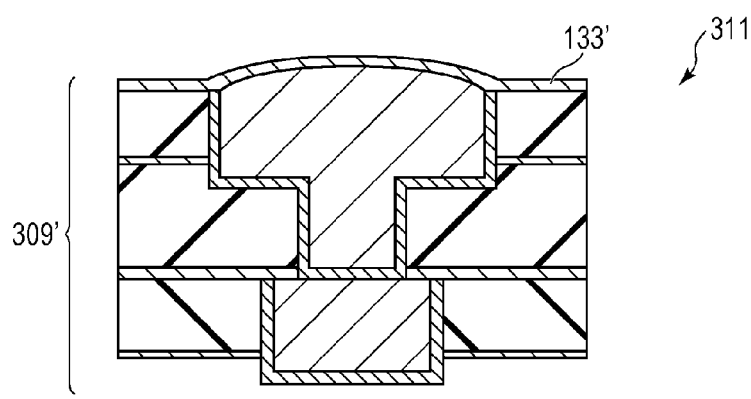
FIG. 9B is a schematic cross-sectional view illustrating a step of the method for manufacturing the bonding portion according to Embodiment 2.
Figure 9C:
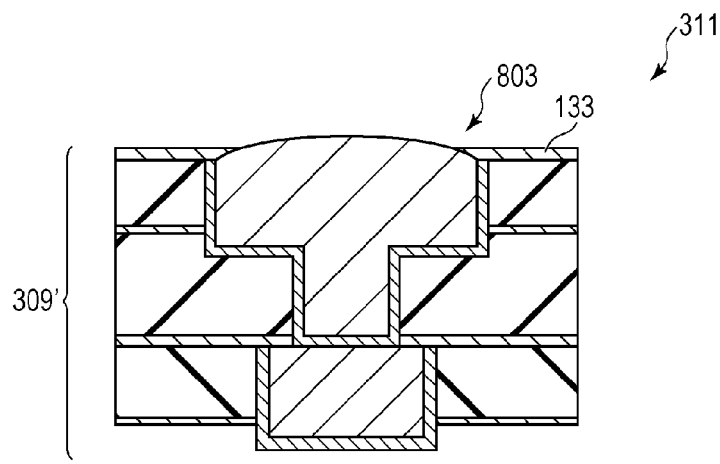
FIG. 9C is a schematic cross-sectional view illustrating a step of the method for manufacturing the bonding portion according to Embodiment 2.

In addition, in FIGS. 9A to 9C, the interlayer insulating film 126 and the interlayer insulating film 127 are each formed of a plurality of insulating films, and a diffusion preventing film 701 covering the upper face of the wiring layer 131 is formed. As described above, the structure of the interlayer insulating film may be appropriately determined.

Hereinbefore, in this embodiment, the modifications of the structure of the bonding portion are described. The modifications described above may be appropriately used in combination and may be appropriately applied to at least one of the first member and the second member.

Figure 10A:
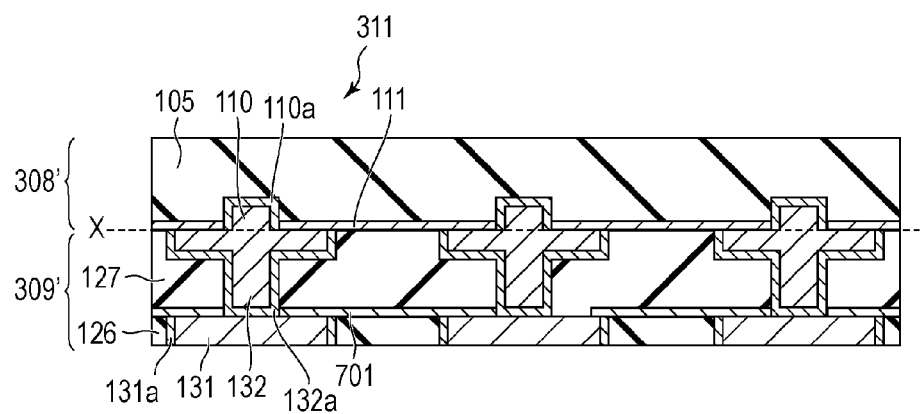
FIG. 10A is a schematic cross-sectional view of a bonding portion of a solid-state image pickup device according to Embodiment 3.
Figure 10B:
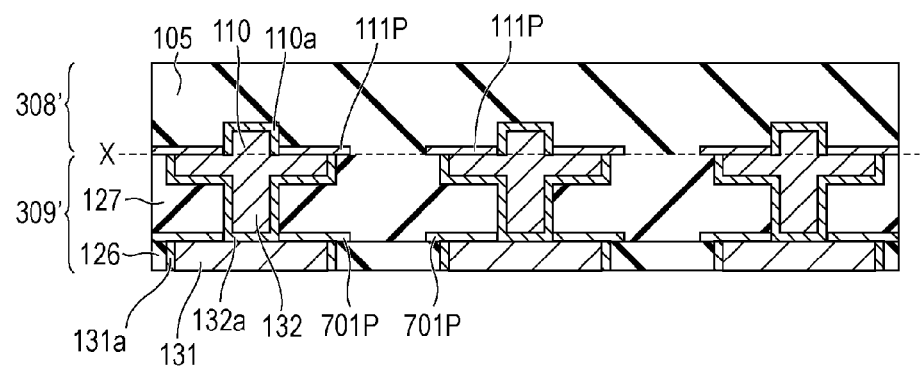
FIG. 10B is a schematic cross-sectional view of a bonding portion of the solid-state image pickup device according to Embodiment 3.
Figure 10C:
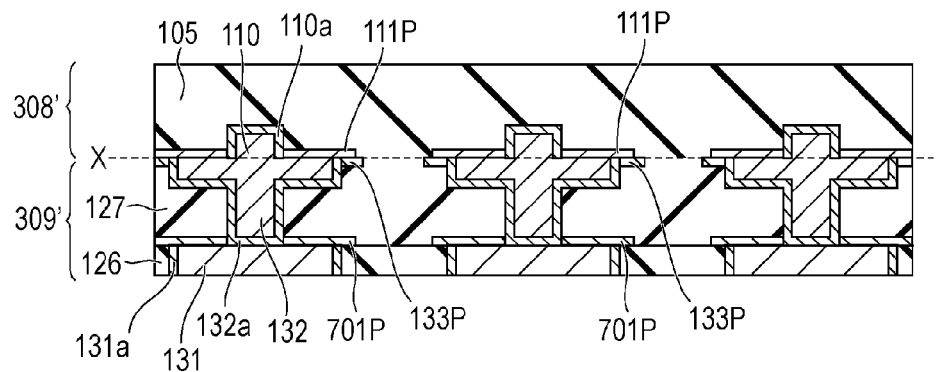
FIG. 10C is a schematic cross-sectional view of a bonding portion of the solid-state image pickup device according to Embodiment 3.

Next, Embodiment 3 of the present invention will be described with reference to FIGS. 10A to 11C. In this embodiment, several modifications of the structure of the bonding portion will be described. FIGS. 10A to 10C are schematic cross-sectional views of the bonding portions described with reference to FIGS. 8A to 8H. In FIGS. 10A to 10C, constituent elements similar to those shown in FIGS. 1 to 7D are designated by the same reference numerals as those described above, and description will be omitted.

FIGS. 10A and 10B correspond to each other and are each a schematic cross-sectional view in which a plurality of bonding portions shown in FIG. 8B or 8D is arranged. FIG. 10C shows the modification of the structure shown in FIG. 10B.

First, in FIG. 10A, the first diffusion preventing film 111 is formed common to a plurality of the bonding portions 311. In FIG. 10B, a first diffusion preventing film 111P is formed by patterning so as to surround the periphery of the corresponding bonding portion, and the first diffusion preventing film 111 between the bonding portions 311 is removed. In addition, compared to the structure shown in FIG. 10B, in FIG. 10C, a second diffusion preventing film 133P is further provided, and the second diffusion preventing film 133P is formed by patterning so as to surround the periphery of the corresponding bonding portion as in the case of the first diffusion preventing film 111P.

In this case, since the first diffusion preventing film is formed of a silicon nitride film, and the interlayer insulating film is formed of silicon oxide, the first diffusion preventing film has a dielectric constant higher than that of the interlayer insulating film. When a film having a high dielectric constant as described above is disposed along the periphery of a wire, the parasitic capacitance thereof is increased. Hence, compared to the structure shown in FIG. 10A, the parasitic capacitance between wires can be reduced by the structure shown in FIG. 10B. In addition, also in the case in which the second diffusion preventing film 133P is provided as shown in FIG. 10C, the parasitic capacitance can be reduced. The diffusion preventing film 701 may also be patterned as shown in FIGS. 10B and 10C.

Figure 11A:
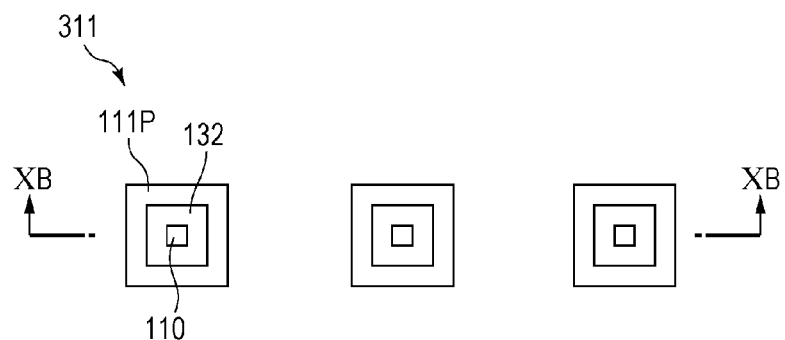
FIG. 11A is a schematic plan view illustrating a bonding portion of the solid-state image pickup device according to Embodiment 3.
Figure 11B:
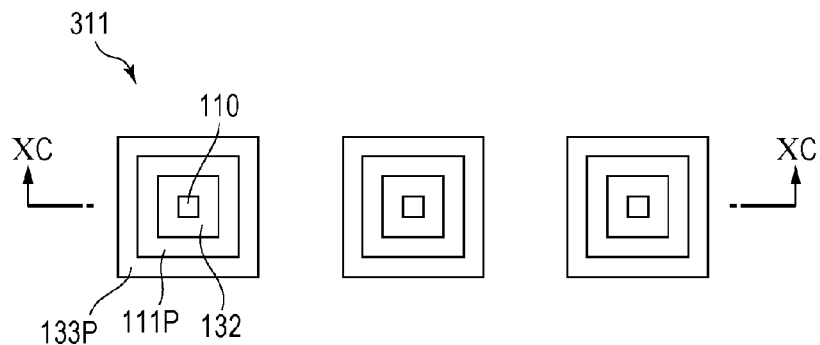
FIG. 11B is a schematic plan view illustrating a bonding portion of the solid-state image pickup device according to Embodiment 3.
Figure 11C:
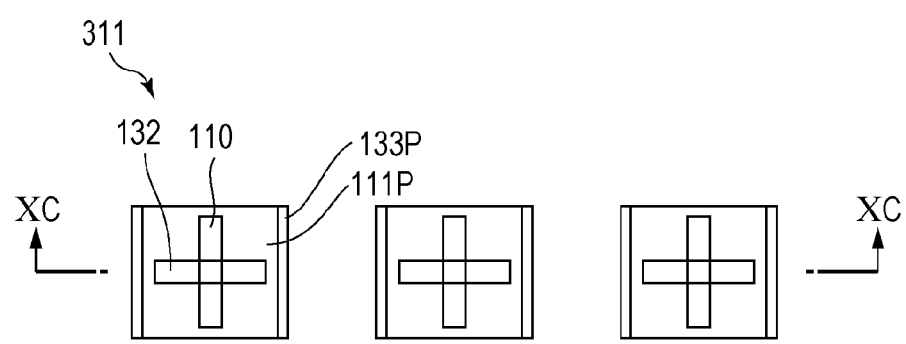
FIG. 11C is a schematic plan view illustrating a bonding portion of the solid-state image pickup device according to Embodiment 3.

FIGS. 11A to 11C are each a schematic plan view of an outer edge of each structure to illustrate the positional relationship of the wiring layer 110, the wiring layer 132, the first diffusion preventing film, and the second diffusion preventing film at the bonding portion 311. In other words, these views show the arrangement of each structure at the bonding plane X. In FIGS. 11A to 11C, constituent elements similar to those shown in FIGS. 1 to 10C are designated by the same reference numerals as those described above, and description will be omitted.

FIG. 11A is a schematic plan view corresponding to FIG. 10B. The line XB-XB shown in FIG. 11A corresponds to the cross-section taken along the bonding plane X of FIG. 10B. As shown in FIG. 11A, the first diffusion preventing film 111P has the largest area and covers the wiring layer 132. That is, a face at which copper of the wiring layer 132 is exposed corresponds to the first diffusion preventing film 111P and the wiring layer 110. By the size relationship between the patterns as described above, copper can be easily covered with the diffusion preventing film.

FIG. 11B and FIG. 11C are schematic plan views corresponding to FIG. 10C. The line XC-XC shown in FIG. 11B and FIG. 11C corresponds to the cross-section taken along the bonding plane X shown in FIG. 10C. In FIG. 11B, the size of the pattern is increased from the wiring layer 110, the wiring layer 132, the first diffusion preventing film 111P, and the second diffusion preventing film 133P in this order. By the size relationship between the patterns as described above, a face at which copper of the wiring layer 132 is exposed corresponds to the first diffusion preventing film 111P and the wiring layer 110, and copper can be easily covered with the diffusion preventing film.

FIG. 11C has different patterns of the wiring layer 110 and the wiring layer 132 from those shown in FIG. 11B. The patterns of the wiring layer 110 and the wiring layer 132 have long sides in a first direction and a second direction different therefrom, respectively. By the patterns as described above, the acceptable range of the positional shift at the bonding can be increased.

As described in this embodiment, the first diffusion preventing film, the second diffusion preventing film, and the bonding portion each may have an arbitrary shape, and the shapes thereof may be appropriately selected.

Hereinafter, as one application example of the solid-state image pickup device of each of the above embodiments, an image pickup system incorporating a solid-state image pickup device will be described by way of example. In the image pickup system, besides devices, such as a camera, primarily used to pickup images, devices (such as a personal computer and a personal digital assistant) auxiliary having an image pickup function are also included. For example, a camera includes the solid-state image pickup device of the present invention and a processing portion which processes a signal outputted from the solid-state image pickup device. This processing portion may include, for example, an A-D converter and a processor processing a digital data outputted therefrom.

As has thus been described, according to the solid-state image pickup device of the present invention, a solid-state image pickup device capable of suppressing the generation of dark current and/or leakage current can be provided.

In addition, the present invention is not limited to the structures described in the specification and may also be applied to the case in which the pixel circuit is changed and only the photoelectric converters are arranged for the first member. Furthermore, the present invention may be appropriately applied, for example, to the structure in which the conductive and/or circuit type is changed to a reversed type, the structure in which a wiring layer and an interlayer insulating film are further provided, and the case in which a single damascene structure is changed to a dual damascene structure. In addition, the structures of the embodiments may also be used in combination.

Furthermore, the present invention is not limited to a solid-state image pickup device and may also be applied to common semiconductor devices, such as a DRAM.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-156926, filed Jul. 9, 2010, which is hereby incorporated by reference herein in its entirety.

REFERENCE SIGNS LIST 301 pixel portion
302 peripheral circuit portion
308 first member
309 second member
149 first wiring structure
150 second wiring structure
311 bonding portion
314 bonding portion
101 first substrate
121 second substrate
X bonding plane
111 first diffusion preventing film
133 second diffusion preventing film

The invention claimed is:

1. A solid-state image pickup device comprising:
a first substrate provided with a photoelectric converter disposed on its primary face;
a first wiring structure which is disposed on the primary face of the first substrate and which has a first bonding portion containing a conductive material;
a second substrate provided with, on its primary face, a part of a peripheral circuit including a control circuit and a readout circuit reading out a signal based on a charge of the photoelectric converter; and
a second wiring structure which is disposed on the primary face of the second substrate and which has a second bonding portion containing a conductive material,
wherein the first bonding portion and the second bonding portion are bonded so that the first substrate, the first wiring structure, the second wiring structure, and the second substrate are disposed in this order, and
the conductive material of the first bonding portion and the conductive material of the second bonding portion are surrounded with diffusion preventing films,
wherein the diffusion preventing films include at least one of
a first diffusion preventing film which forms an upper face of the first wiring structure together with the first bonding portion, and
a second diffusion preventing film which forms an upper face of the second wiring structure together with the second bonding portion.

2. The solid-state image pickup device according to claim 1, wherein
the diffusion preventing films include the first diffusion preventing film, and the first diffusion preventing film surrounds the first bonding portion, and/or
the diffusion preventing films include the second diffusion preventing film, and the second diffusion preventing film surrounds the second bonding portion.

3. The solid-state image pickup device according to claim 1, wherein at least one of the first diffusion preventing film and the second diffusion preventing film is a silicon nitride film, a silicon oxynitride film, a silicon carbonitride film, or a silicon carbide film.

* * * * *